US012813305B2

(12) United States Patent
Otsubo et al.

(10) Patent No.: US 12,813,305 B2
(45) Date of Patent: Nov. 24, 2026

(54) INTERPOSER

(71) Applicant: Murata Manufacturing Co., Ltd., Kyoto-fu (JP)

(72) Inventors: Yoshihito Otsubo, Nagaokakyo (JP); Yutaka Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 353 days.

(21) Appl. No.: 18/429,994

(22) Filed: Feb. 1, 2024

(65) Prior Publication Data

US 2024/0170352 A1 May 23, 2024

Related U.S. Application Data

(63) Continuation of application No. PCT/JP2022/028717, filed on Jul. 26, 2022.

(30) Foreign Application Priority Data

Aug. 13, 2021 (JP) ................................ 2021-131899

(51) Int. Cl.
*H10W 70/68* (2026.01)
*H10W 20/40* (2026.01)
(Continued)

(52) U.S. Cl.
CPC ......... *H10W 70/68* (2026.01); *H10W 20/435* (2026.01); *H10W 20/496* (2026.01); *H10W 70/63* (2026.01); *H10W 70/635* (2026.01); *H10W 74/111* (2026.01); *H10W 90/00* (2026.01); *H10W 90/724* (2026.01)

(58) Field of Classification Search
CPC . H10W 70/68; H10W 74/111; H10W 20/435; H10W 20/496; H10W 70/635; H10W 70/63; H10W 74/00; H10W 90/724; H10W 90/00
See application file for complete search history.

(56) References Cited

U.S. PATENT DOCUMENTS 10,321,575 B2 6/2019 Li et al.
2005/0258548 A1* 11/2005 Ogawa ................ H10W 44/601 257/737

(Continued)

FOREIGN PATENT DOCUMENTS

JP 2000-349225 A 12/2000
JP 2002-084071 A 3/2002

(Continued)

OTHER PUBLICATIONS

International Search Report for PCT/JP2022/028717 dated Oct. 18, 2022.

*Primary Examiner* — Alonzo Chambliss
(74) *Attorney, Agent, or Firm* — McDonald Hopkins LLC

(57) ABSTRACT

An interposer has a first surface as a mounting surface and a second surface where an object is to be mounted, the second surface being opposite to the first surface, and the interposer includes: a first component that is exposed directly on the second surface or connected to the second surface via a conductor, the first component being included inside the interposer and located at a position closer to the second surface than to the first surface; and a sealing resin layer that seals the first component.

11 Claims, 8 Drawing Sheets

(51) Int. Cl.

| | |
|---|---|
| ***H10W 20/41*** | (2026.01) |
| ***H10W 70/63*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 2013/0175686 | A1 * | 7/2013 | Meyer | H10W 72/072 257/737 |
| 2018/0182700 | A1 * | 6/2018 | Sato | H05K 1/0268 |
| 2020/0083179 | A1 | 3/2020 | Lee et al. | |
| 2020/0273784 | A1 | 8/2020 | Mallik et al. | |
| 2022/0328417 | A1 * | 10/2022 | Patil | H10W 70/05 |

FOREIGN PATENT DOCUMENTS

| | | | |
|---|---|---|---|
| JP | 2016-096196 | A | 5/2016 |
| JP | 6290464 | B2 | 3/2018 |
| JP | 2020-043320 | A | 3/2020 |

* cited by examiner

INTERPOSER

CROSS REFERENCE TO RELATED APPLICATION

This is a continuation of International Application No. PCT/JP2022/028717 filed on Jul. 26, 2022 which claims priority from Japanese Patent Application No. 2021-131899 filed on Aug. 13, 2021. The contents of these applications are incorporated herein by reference in their entireties.

BACKGROUND OF THE DISCLOSURE

Field of the Disclosure

The present disclosure relates to interposers.

Description of the Related Art

U.S. Pat. No. 10,321,575 B2 (PTL 1) describes an IC module. In PTL 1, an interposer is mounted on the upper surface of a printed wiring board and an IC package is mounted on the interposer. On the lower surface of the interposer, the lower end of a through electrode provided so as to pass through the interposer is exposed, and further, the lower surface of a component included in the interposer is also exposed. Since the thickness of the interposer is larger than the thickness of the included component, an electrode extending in the thickness direction is also provided on the upper side of the included component. A rewiring layer is provided on the upper surface of the interposer. The IC package is provided with a plurality of electrodes and the plurality of electrodes are electrically connected to the rewiring layer.

PTL 1: U.S. Pat. No. 10,321,575 B2

BRIEF SUMMARY OF THE DISCLOSURE

When a matching circuit is arranged on the periphery of an IC and wiring for connection between the IC and the matching circuit is long, noise can be mixed into a signal passing through the wiring. When a decoupling capacitor is connected to an IC and wiring for connection between the IC and the decoupling capacitor is long, noise can also be mixed into a signal passing through the wiring. It is desirable that such mixing of noise into wiring be avoided as much as possible. It is particularly desirable that mixing of noise into wiring between what is mounted on the interposer and a component inside the interposer be avoided as much as possible.

Accordingly, an object of the present disclosure is to provide an interposer that hinders noise from being mixed into wiring between what is mounted on the interposer and a component inside the interposer.

In order to achieve the object, an interposer based on the present disclosure has a first surface as a mounting surface, and a second surface where an object is to be mounted, the second surface being opposite to the first surface, and the interposer includes: a first component that is exposed directly on the second surface or connected to the second surface via a conductor, the first component being included inside the interposer and located at a position closer to the second surface than to the first surface; and a sealing resin layer that seals the first component.

According to the present disclosure, the first component is included inside the interposer and located at a position closer to the second surface, so that the wiring between the first component and the object can be shortened to a great degree and, as a result, the interposer can be implemented that hinders noise from being mixed into wiring between what is mounted on the interposer and a component inside the interposer.

DETAILED DESCRIPTION OF THE DISCLOSURE

Figure 1:
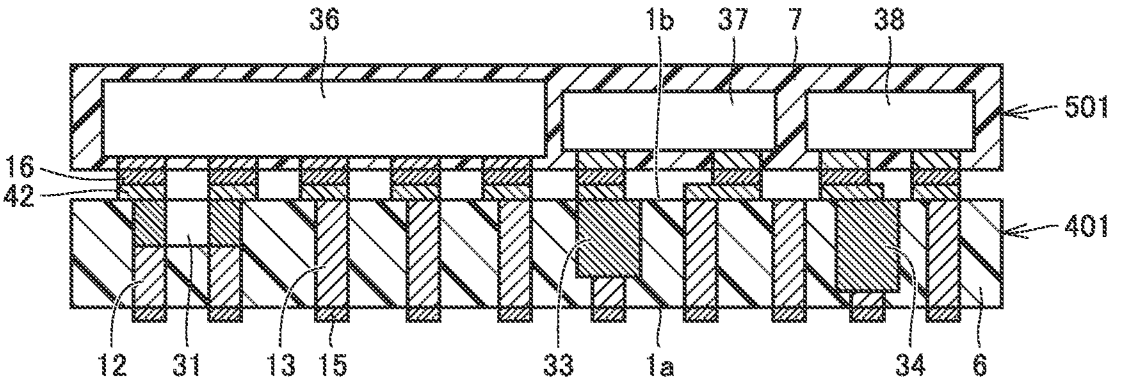
FIG. 1 is a cross-sectional view of an interposer according to a first embodiment based on the present disclosure, where a coreless substrate is mounted.

The dimensional ratios in the drawings do not necessarily reflect real ones faithfully but for explanatory convenience, the dimensional ratios may be exaggerated when illustrated. When the concept of up or down orientation is mentioned in the description below, the orientation does not necessarily represent the absolute upper or lower side but a relative upper or lower side in an illustrated position may be implied.

First Embodiment

Referring to FIG. 1, an interposer according to a first embodiment based on the present disclosure is described. FIG. 1 presents a cross-sectional view of interposer 401 according to the present embodiment, where a coreless substrate 501 is mounted.

Interposer 401 has a first surface 1*a* as a mounting surface, and a second surface 1*b* where an object is to be mounted, second surface 1*b* being opposite to first surface 1*a*. Interposer 401 includes a first component 31 and a sealing resin layer 6. First component 31 is electrically connected to second surface 1*b*, included inside the interposer and located at a position closer to second surface 1*b* than to first surface 1*a*. In other words, first component 31 is included inside the interposer and located at a position closer to second surface 1*b* than to first surface 1*a*, while being exposed directly on second surface 1*b* or connected to second surface 1*b* via a conductor. Sealing resin layer 6 seals first component 31. "First surface 1*a* as a mounting surface" refers to first surface 1*a* as a surface to be mounted on a surface of a mother substrate, for example.

Interposer 401 includes components 33 and 34, for example, in addition to first component 31. First component 31 and components 33 and 34 are each a capacitor for example. First component 31 and components 33 and 34 are each a decoupling capacitor, for example. A second-surface-side wiring layer 42 is disposed on second surface 1*b*.

Columnar conductors 12 and 13 are arranged in sealing resin layer 6. Columnar conductor 12 electrically connects the lower surface of an electrode of the component and the lower surface of sealing resin layer 6. Columnar conductor 13 electrically connects the upper and lower surfaces of sealing resin layer 6.

First component 31 has an electrode on its upper surface. The electrode on the upper surface of first component 31 is exposed on the upper surface of sealing resin layer 6. On the upper surface of sealing resin layer 6, second-surface-side wiring layer 42 is disposed. Second-surface-side wiring layer 42 is a so-called re-wiring layer. The electrode on the upper surface of first component 31 is electrically connected to second-surface-side wiring layer 42. The lower surface of columnar conductors 12, 13 is exposed on the lower surface of sealing resin layer 6, and the lower surface of columnar conductors 12, 13 is covered with plating film 15. The upper surface of second-surface-side wiring layer 42 includes a region used for connection and this region is covered with plating film 16. Plating film 16 is a part of interposer 401.

In the present embodiment, the object to be mounted on interposer 401 is coreless substrate 501. Coreless substrate 501 includes components 36, 37, and 38 inside. Components 36, 37, and 38 are sealed with a sealing resin layer 7. Electrodes are provided on the respective lower surfaces of components 36, 37, and 38. The respective electrodes of components 36, 37, and 38 are exposed on the lower surface of coreless substrate 501. Component 36 is an IC, for example.

In the present embodiment, first component 31 is included inside the interposer and located at a position closer to second surface 1*b*, and therefore, the wiring between first component 31 and the object can be shortened remarkably, so that the interposer can be implemented that hinders noise from being mixed into the wiring between what is mounted on the interposer and the component inside the interposer.

Particularly in the case where first component 31 is a decoupling capacitor, first component 31 and component 36 included inside coreless substrate 501 can be connected to each other with a remarkably short distance therebetween, which consequently enables the interposer to have high functionality. This is particularly effective in the case where component 36 is an IC.

The same applies as well to components 33 and 34 included inside interposer 401. Specifically, in the case where components 33 and 34 are each a decoupling capacitor, the decoupling capacitor and components 37 and 38 included inside coreless substrate 501 can be connected with a remarkably short distance therebetween, which consequently enables the interposer to have high functionality.

As illustrated above in connection with the present embodiment, first component 31 is preferably a capacitor. This configuration can be employed to remarkably shorten the wiring from the capacitor to other components, which therefore enables reduction of mixture of noise.

As illustrated above in connection with the present embodiment, the object is preferably a coreless substrate. This configuration can be employed to reduce the height of the whole including the object.

Second Embodiment

Figure 2:
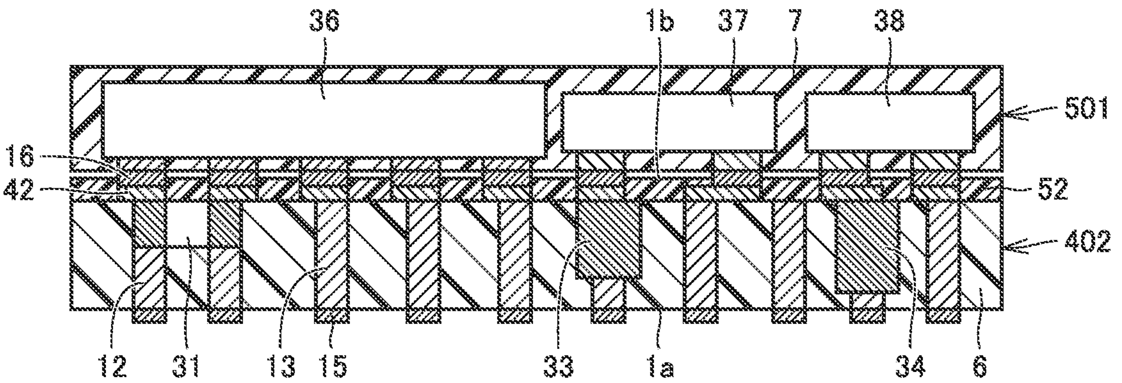
FIG. 2 is a cross-sectional view of an interposer according to a second embodiment based on the present disclosure, where a coreless substrate is mounted.

Referring to FIG. 2, an interposer according to a second embodiment based on the present disclosure is described. FIG. 2 presents a cross-sectional view of interposer 402 according to the present embodiment, where coreless substrate 501 is mounted.

Interposer 402 has a basic configuration similar to the one described above regarding interposer 401 in the first embodiment. Interposer 402 in the present embodiment, however, has the following configuration.

In second surface 1*b* of interposer 402, a second-surface-side outer resin layer 52 is disposed to cover sealing resin layer 6. A second-surface-side wiring layer 42 is disposed between second-surface-side outer resin layer 52 and sealing resin layer 6. Electrical connection from first component 31 to second surface 1*b* is made via second-surface-side wiring layer 42. Second-surface-side outer resin layer 52 is a resist layer, for example.

In a region where second-surface-side wiring layer 42 is exposed from second-surface-side outer resin layer 52, the upper surface of second-surface-side wiring layer 42 is covered with a plating film 16. Plating film 16 is a part of interposer 402.

In the present embodiment as well, similar advantageous effects to those in the first embodiment can be obtained. This configuration can be employed to draw wiring to a desired position in second surface 1*b* via second-surface-side wiring layer 42 which is covered with second-surface-side outer resin layer 52, and then expose an electrode on second surface 1*b*. Thus, even when the position of an electrode of coreless substrate 501 to be mounted differs from the position of an electrode within interposer 402, wiring can be drawn through second-surface-side wiring layer 42 to a position where the wiring is required, to make electrical connection efficiently. In this example, a part of the surface of second-surface-side wiring layer 42 that is not used as a land where a component is to be mounted, i.e., a part to which no solder is joined, is covered with second-surface-side outer resin layer 52, and therefore, short circuit to an adjacent solder joint can be made less likely to occur.

(Method for Manufacturing)

Referring to FIGS. 3 to 12, a method for manufacturing interposer 402 according to the present embodiment is described.

Figure 3:
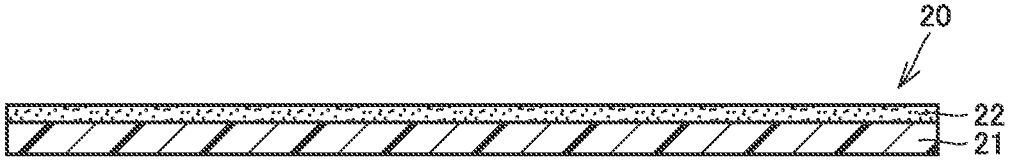
FIG. 3 is an explanatory view for a first step in a method for manufacturing an interposer according to the second embodiment based on the present disclosure.

First, a carrier 20 as illustrated in FIG. 3 is prepared. Carrier 20 includes a resin layer 21 and an adhesive layer 22 that covers one surface of resin layer 21. Carrier 20 is arranged so that its adhesive layer 22 side faces upward.

Figure 4:
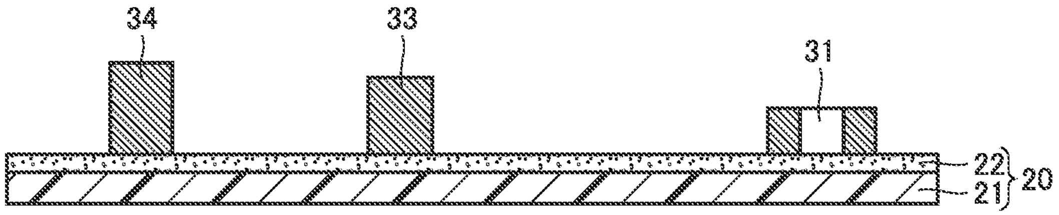
FIG. 4 is an explanatory view for a second step in the method for manufacturing an interposer according to the second embodiment based on the present disclosure.

As illustrated in in FIG. 4, first components 31 and components 33 and 34 are bonded onto adhesive layer 22 in a desired positional relation therebetween.

Figure 5:
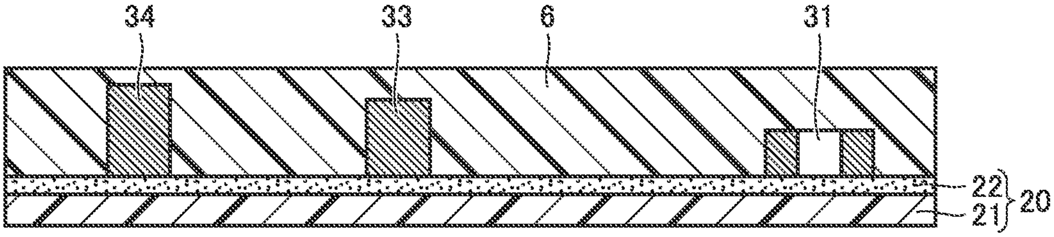
FIG. 5 is an explanatory view for a third step in the method for manufacturing an interposer according to the second embodiment based on the present disclosure.
Figure 6:
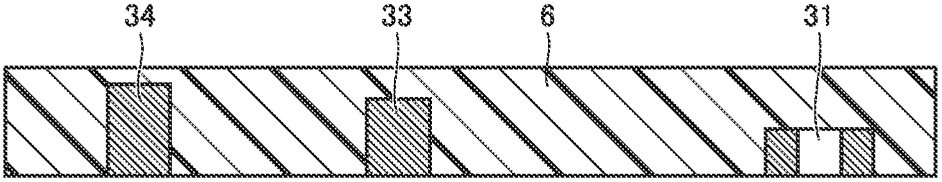
FIG. 6 is an explanatory view for a fourth step in the method for manufacturing an interposer according to the second embodiment based on the present disclosure.

As illustrated in FIG. 5, resin molding is performed. Thus, sealing resin layer 6 is formed. First component 31 and components 33 and 34 are covered with sealing resin layer 6. Carrier 20 is thereafter removed to generate the state illustrated in FIG. 6.

Figure 7:
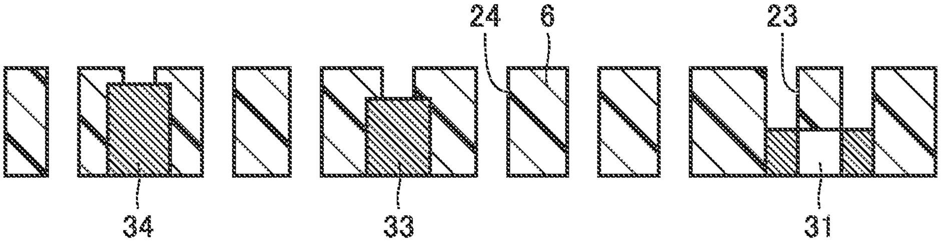
FIG. 7 is an explanatory view for a fifth step in the method for manufacturing an interposer according to the second embodiment based on the present disclosure.

As illustrated in FIG. 7, boring is performed. Thus, vertical holes 23 and 24 are formed. The boring can be carried out by laser machining for example. Vertical hole 23 reaches the upper surface of first component 31 or components 33, 34. Vertical hole 24 extends through sealing resin layer 6.

Figure 8:
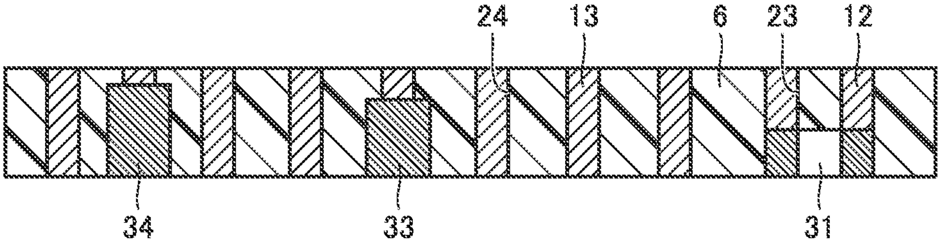
FIG. 8 is an explanatory view for a sixth step in the method for manufacturing an interposer according to the second embodiment based on the present disclosure.

As illustrated in FIG. 8, vertical holes 23 and 24 are filled with a metal material. Thus, columnar conductors 12 and 13 are formed. This step may be carried out through plating or be carried out through filling with a conductive paste. When it is carried out through plating, electrolytic plating may be performed after bonding a plate material with a conductive outer surface, to the lower surface of sealing resin layer 6. The conductive outer surface of the plate material serves as a seed layer.

When columnar conductors 12 and 13 are formed by filling with a conductive paste, the filling may be performed with a certain plate material abutting against the lower surface of sealing resin layer 6.

Figure 9:
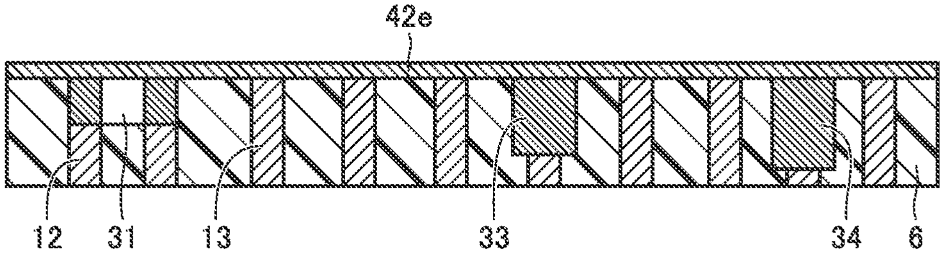
FIG. 9 is an explanatory view for a seventh step in the method for manufacturing an interposer according to the second embodiment based on the present disclosure.
Figure 10:
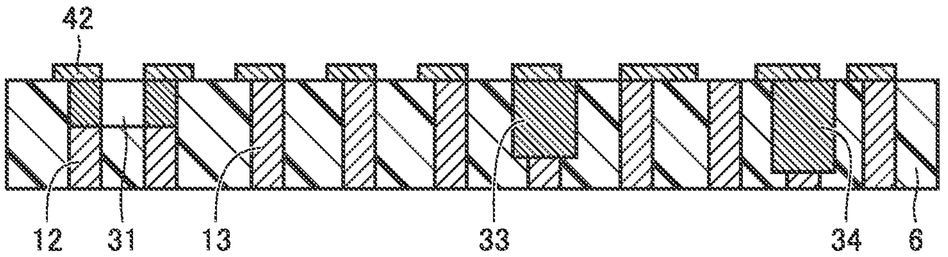
FIG. 10 is an explanatory view for an eighth step in the method for manufacturing an interposer according to the second embodiment based on the present disclosure.

As illustrated in FIG. 9, a metal film 42*e* is formed to cover the upper surface. Metal film 42*e* may be a Cu film, for example. Metal film 42*e* is patterned by photolithography or the like to form second-surface-side wiring layer 42 as illustrated in FIG. 10. Second-surface-side wiring layer 42 is disposed to cover regions where respective upper surfaces of columnar conductors 12, 13 are exposed on the upper surface of sealing resin layer 6. In FIG. 10, second-surface-side wiring layer 42 is depicted as being located in these regions only, however, second-surface-side wiring layer 42 may also be formed to be located in regions other than the aforementioned regions. Second-surface-side wiring layer 42 may be wiring made of Cu.

Figure 11:
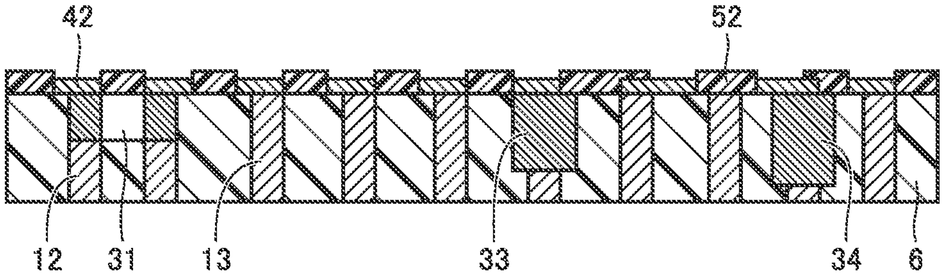
FIG. 11 is an explanatory view for a ninth step in the method for manufacturing an interposer according to the second embodiment based on the present disclosure.

As illustrated in FIG. 11, second-surface-side outer resin layer 52 is formed. Second-surface-side outer resin layer 52 is a resist film, for example. Second-surface-side outer resin layer 52 has some openings. Second-surface-side outer resin layer 52 can be formed by printing. Alternatively, second-surface-side outer resin layer 52 may be formed to cover the whole surface, and unnecessary portions may thereafter be removed.

Figure 12:
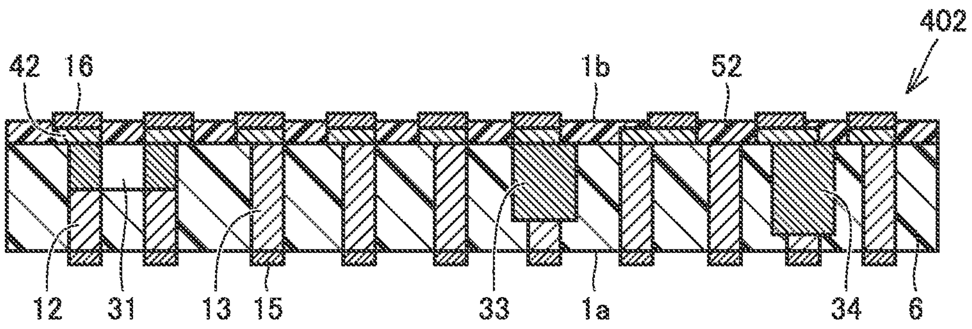
FIG. 12 is a cross-sectional view of the interposer according to the second embodiment based on the present disclosure.

As illustrated in FIG. 12, plating films 15 and 16 are formed. Plating films 15 and 16 are formed by plating. At this time, interposer 402 is obtained. Plating films 15 and 16 may each be a stack of different types of plating films. For example, Ni plating may be performed to form an Ni film, and thereafter Au plating may be performed to form an Au film. In this case, plating films 15 and 16 are each a dual layer structure including the Ni film and the Au film.

Coreless substrate 501 can be mounted on second surface 1*b* of this interposer 402 to obtain the structure illustrated in FIG. 2.

Third Embodiment

Figure 13:
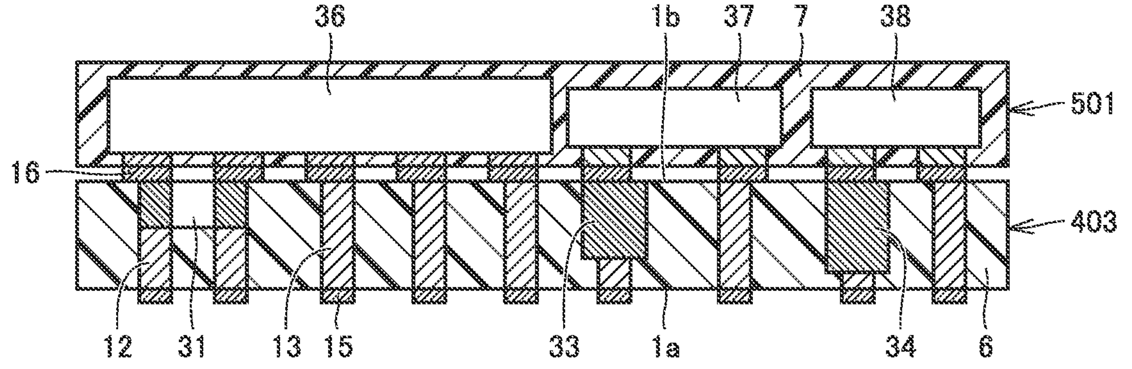
FIG. 13 is a cross-sectional view of an interposer according to a third embodiment based on the present disclosure, where a coreless substrate is mounted.

Referring to FIG. 13, an interposer according to a third embodiment based on the present disclosure is described. FIG. 13 presents a cross-sectional view of interposer 403 according to the present embodiment, where coreless substrate 501 is mounted.

Interposer 403 also has a basic configuration similar to the one described above regarding interposer 401 in the first embodiment. Interposer 403 in the present embodiment, however, is not provided with second-surface-side wiring layer 42. First component 31 and components 33 and 34 are exposed on second surface 1*b*, and regions, in the exposed surface, to be used for connection are covered with plating film 16. Plating film 16 may extend laterally beyond the top surface of columnar conductor 13.

In the present embodiment as well, similar advantageous effects to those in the first embodiment can be obtained. The present embodiment can be employed particularly advantageously when the layout of electrodes on second surface 1*b* of interposer 403 matches the layout of electrodes on the lower surface of coreless substrate 501. In the present embodiment, second-surface-side wiring layer 42 is not provided, and therefore, the number of steps of the manufacturing method can be reduced, and accordingly the cost can be reduced.

Fourth Embodiment

Figure 14:
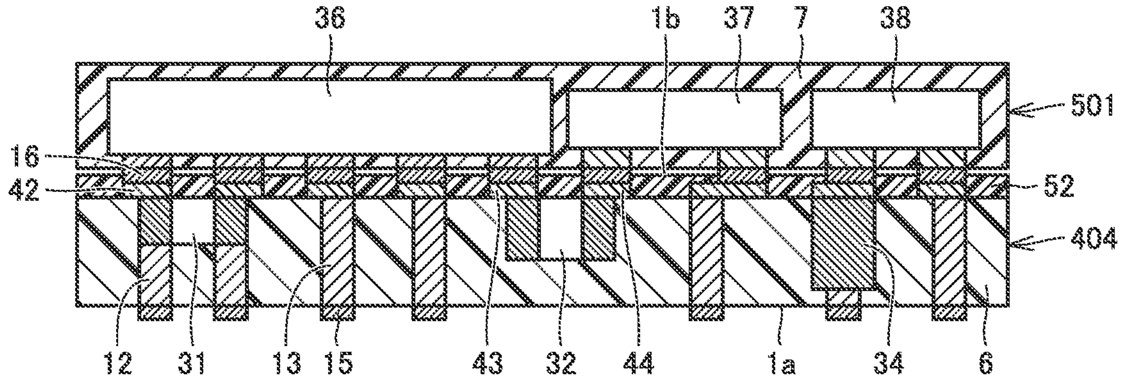
FIG. 14 is a cross-sectional view of an interposer according to a fourth embodiment based on the present disclosure, where a coreless substrate is mounted.

Referring to FIG. 14, an interposer according to a fourth embodiment based on the present disclosure is described. FIG. 14 presents a cross-sectional view of interposer 404 according to the present embodiment, where coreless substrate 501 is mounted.

Interposer 404 also has a basic configuration similar to the one described above regarding interposer 401 in the first embodiment. Interposer 404 in the present embodiment, however, has the following configuration.

Interposer 404 includes a second component 32 included inside the sealing resin layer. On the second surface 1*b* side, a first electrode 43 to be connected to a component 36 that is a third component included in the object, as well as a second electrode 44 to be connected to a component 37 that is a fourth component included in the object, are arranged. Second component 32 is connected to both first electrode 43 and second electrode 44. Second component 32 is a capacitor. Second component 32 is provided with separate electrodes, one of which is an electrode to be connected to first electrode 43, and the other is an electrode to be connected to second electrode 44. The object is coreless substrate 501. Components 36 and 37 are included inside coreless substrate 501.

In the present embodiment as well, similar advantageous effects to those in the first embodiment can be obtained. This configuration can be employed to dispose, within the interposer, second component 32 to be connected between the two components included in the object, and therefore, the space can be saved and the functionality of the interposer can be enhanced.

As illustrated above in connection with the present embodiment, second component 32 is preferably a capacitor. This configuration can be employed to efficiently dispose the capacitor which should be disposed between the third component and the fourth component.

First Modification

Figure 15:
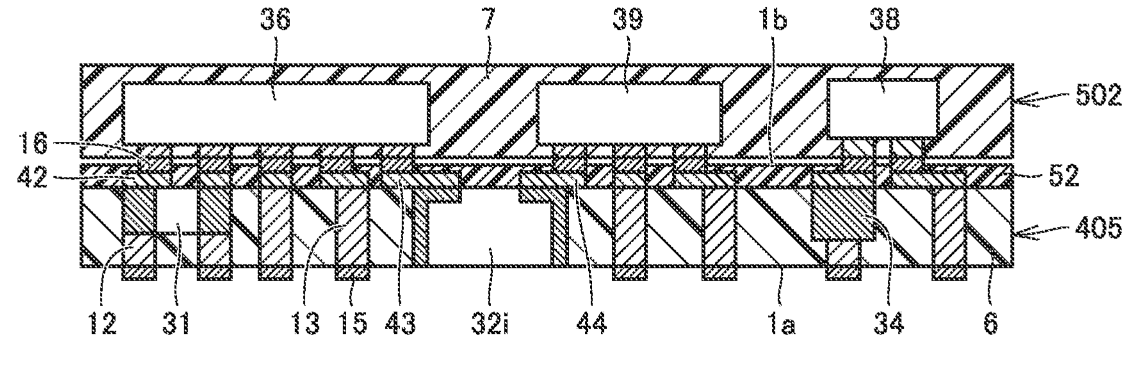
FIG. 15 is a cross-sectional view of an interposer according to a first modification of the fourth embodiment based on the present disclosure, where a coreless substrate is mounted.

Referring to FIG. 15, an interposer 405 as a first modification of the interposer in the present embodiment is described. FIG. 15 is a cross-sectional view of interposer 405 where a coreless substrate 502 is mounted. A second component 32*i* is included inside interposer 405. Second component 32*i* is a capacitor. While FIG. 14 shows the exterior of second component 32 rather than a cross section thereof, for the sake of convenience of description, FIG. 15 shows a cross section of second component 32*i*. Second component 32*i* is exposed on first surface 1*a*. Second component 32*i* is provided with separate electrodes, one of which is an electrode located near second surface 1*b* and connected to first electrode 43, and the other is an electrode located near second surface 1*b* and connected to second electrode 44. As illustrated in FIG. 15, the electrodes of second component 32*i* are each substantially L-shaped in the cross section. Actually, second component 32*i* may be provided with internal electrodes. While FIG. 15 does not show the internal electrodes of second component 32*i*, the internal electrodes of second component 32*i* may be disposed in the central blank portion in second component 32*i* in such a manner that the internal electrodes alternately extend from an electrode provided on the left wall and an electrode provided on the right wall, for example.

The surface where second component 32*i* is exposed on first surface 1*a* may be a surface of second component 32*i* that is formed by being cut by polishing. In such a configuration, second component 32*i* is exposed on first surface 1*a*, and therefore, heat dissipation from second component 32*i* can be promoted.

A component 39 is included inside coreless substrate 502. Component 39 is a fourth component in this case.

Second Modification

Figure 16:
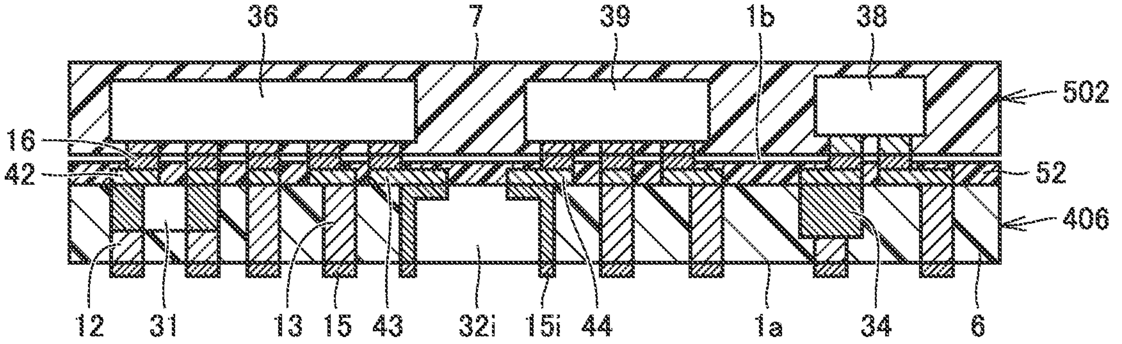
FIG. 16 is a cross-sectional view of an interposer according to a second modification of the fourth embodiment based on the present disclosure, where a coreless substrate is mounted.

Referring to FIG. 16, an interposer 406 as a second modification of the interposer in the present embodiment is described. FIG. 16 is a cross-sectional view of interposer 406 where coreless substrate 502 is mounted. In interposer 406, the surface where the electrodes of second component 32*i* are exposed on first surface 1*a* is covered with a plating film 15*i*. In such a configuration, plating film 15*i* can be connected to a certain conductor of a mother board, to further promote heat dissipation from second component 32*i*.

Third Modification

Figure 17:
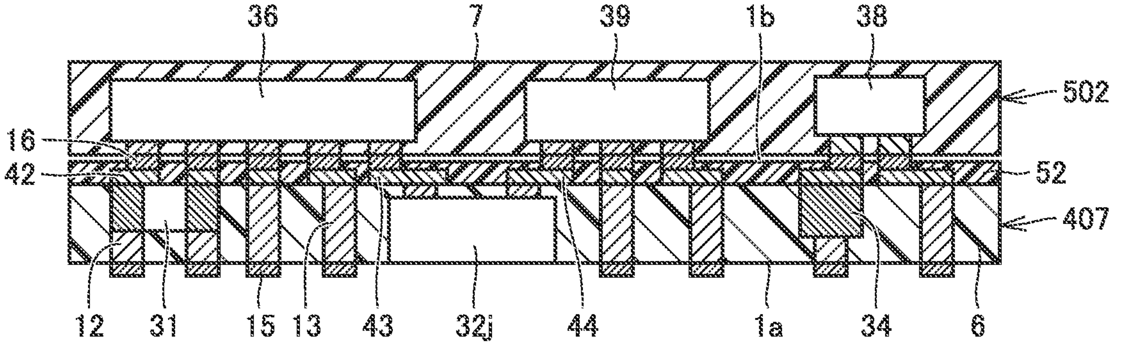
FIG. 17 is a cross-sectional view of an interposer according to a third modification of the fourth embodiment based on the present disclosure, where a coreless substrate is mounted.

Referring to FIG. 17, an interposer 407 as a third modification of the interposer in the present embodiment is described. FIG. 17 is a cross-sectional view of interposer 407 where coreless substrate 502 is mounted. A second component 32*j* is included inside interposer 407. Second component 32*j* is an IC. A surface of second component 32*j* that is located relatively further from coreless substrate 502 is exposed on first surface 1*a*. This surface may be a surface formed by polishing. In such a configuration, second component 32*j* that is an IC is exposed on first surface 1*a*, and therefore, heat dissipation from second component 32*j* can be promoted.

Fourth Modification

Figure 18:
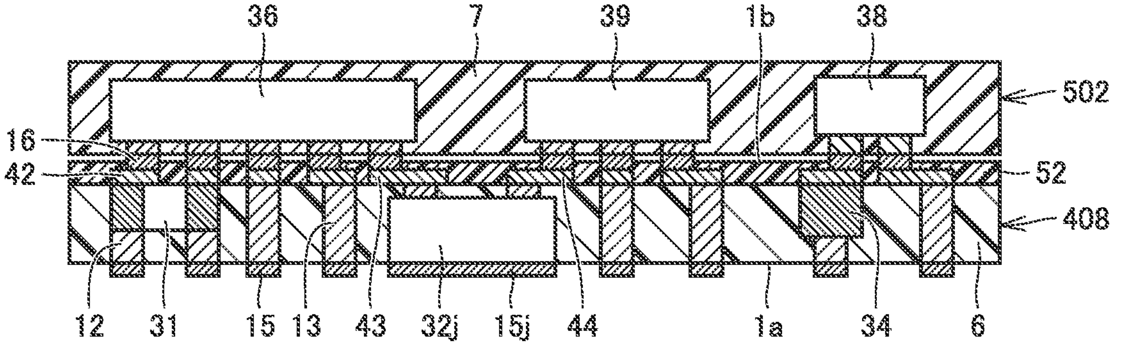
FIG. 18 is a cross-sectional view of an interposer according to a fourth modification of the fourth embodiment based on the present disclosure, where a coreless substrate is mounted.

Referring to FIG. 18, an interposer 408 as a fourth modification of the interposer in the present embodiment is described. FIG. 18 is a cross-sectional view of interposer 408 where coreless substrate 502 is mounted. Regarding interposer 408, the surface where second component 32*j* is exposed on first surface 1*a* is covered with a plating film 15*j*. Second component 32*j* is an IC for example. In such a configuration, heat dissipation from second component 32*j* can further be promoted through plating film 15*j*.

Fifth Modification

Figure 19:
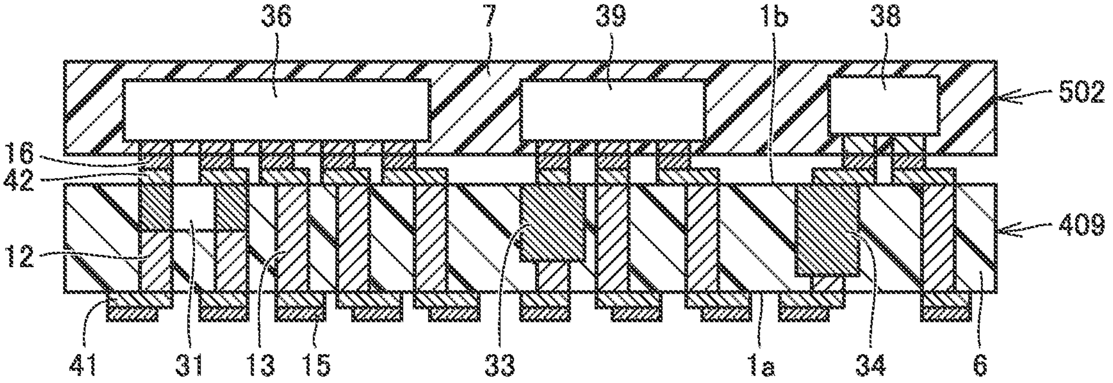
FIG. 19 is a cross-sectional view of an interposer according to a fifth modification of the fourth embodiment based on the present disclosure, where a coreless substrate is mounted.

Referring to FIG. 19, an interposer 409 as a fifth modification of the interposer in the present embodiment is described. FIG. 19 is a cross-sectional view of interposer 409 where coreless substrate 502 is mounted. Regarding interposer 409, a first-surface-side wiring layer 41 is disposed on first surface 1*a* to cover sealing resin layer 6. A region of the lower surface of first-surface-side wiring layer 41 that is to be used for connection is covered with plating film 15. Such a plating film 15 can be formed by partial plating by means of masking, for example.

In this example, component 39 is included inside coreless substrate 502. While electrodes are located closely to each other on the lower surfaces of components 36 and 39, electrodes on first surface 1*a* of interposer 409 can be extended through first-surface-side wiring layer 41 to desired positions, and therefore, the electrodes can be arranged at a sufficient distance therebetween on first surface 1*a*. In this way, mounting on a mother substrate, for example, can be facilitated.

Sixth Modification

Figure 20:
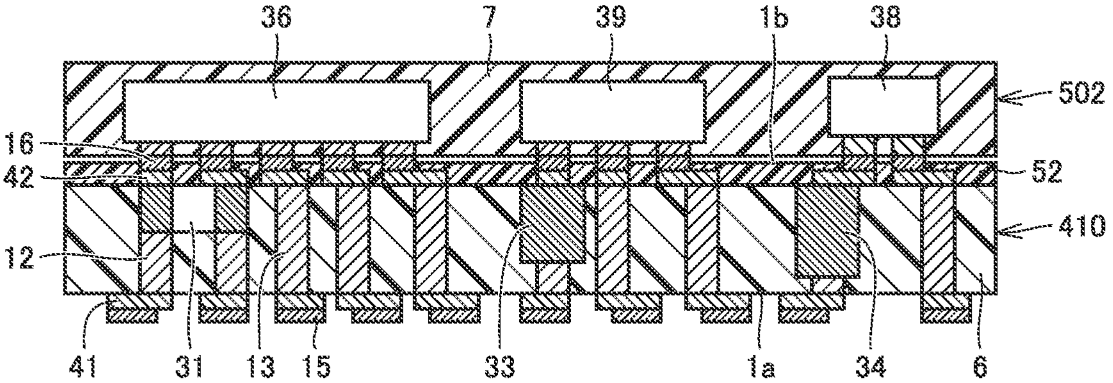
FIG. 20 is a cross-sectional view of an interposer according to a sixth modification of the fourth embodiment based on the present disclosure, where a coreless substrate is mounted.

Referring to FIG. 20, an interposer 410 as a sixth modification of the interposer in the present embodiment is described. FIG. 20 is a cross-sectional view of interposer 410 where coreless substrate 502 is mounted. Regarding interposer 410, second-surface-side outer resin layer 52 is disposed in second surface 1*b* to cover sealing resin layer 6. In this example, a part of the surface of second-surface-side wiring layer 42 that is not used as a land where a component is to be mounted, i.e., a part to which no solder is joined, is covered with second-surface-side outer resin layer 52, and therefore, short circuit to an adjacent solder joint can be made less likely to occur.

Seventh Modification

Figure 21:
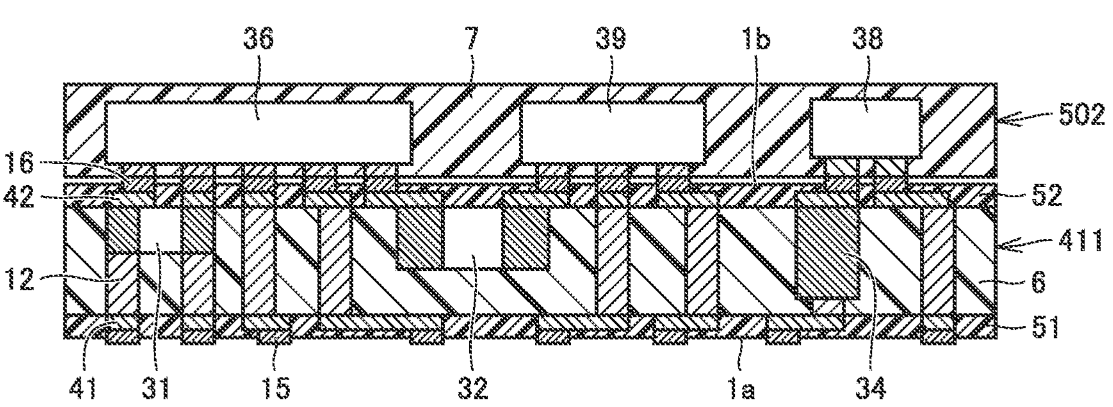
FIG. 21 is a cross-sectional view of an interposer according to a seventh modification of the fourth embodiment based on the present disclosure, where a coreless substrate is mounted.

Referring to FIG. 21, an interposer 411 as a seventh modification of the interposer in the present embodiment is described. FIG. 21 is a cross-sectional view of interposer 411 where coreless substrate 502 is mounted. Second component 32 is included inside interposer 411. Second component 32 is connected to both component 36 and component 39 included inside coreless substrate 502.

In first surface 1*a* of interposer 411, first-surface-side outer resin layer 51 is disposed to cover sealing resin layer 6. First-surface-side wiring layer 41 is disposed between first-surface-side outer resin layer 51 and sealing resin layer 6. Electrical connection from first component 31 to first surface 1*a* is made via first-surface-side wiring layer 41. First-surface-side outer resin layer 51 is a resist layer, for example. In this example, a part of the surface of first-surface-side wiring layer 41 that is not used as a land where a component is to be mounted, i.e., a part to which no solder is joined, is covered with first-surface-side outer resin layer 51, and therefore, short circuit to an adjacent solder joint can be made less likely to occur. The position of an electrode on first surface 1*a* can be extended to a desired position through first-surface-side wiring layer 41. The electrode extension by first-surface-side wiring layer 41 enables the position where the electrode is exposed on first surface 1*a* to be defined within a region where second component 32 is projected.

Eighth Modification

Figure 22:
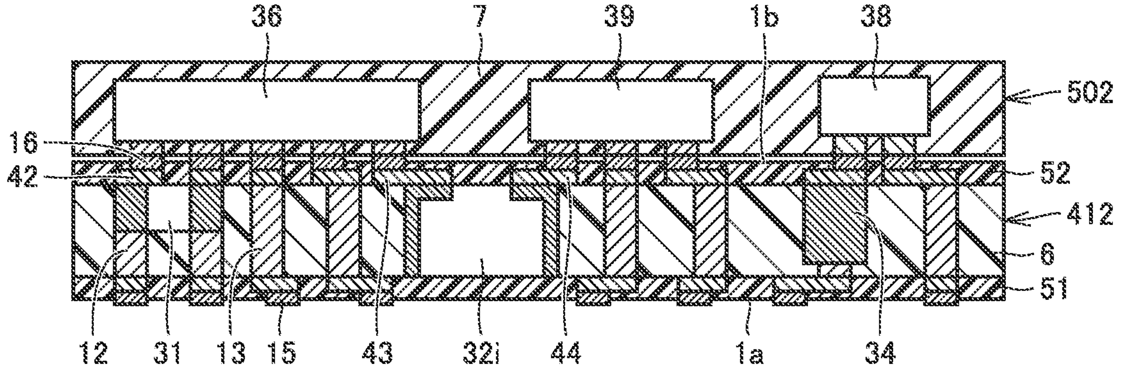
FIG. 22 is a cross-sectional view of an interposer according to an eighth modification of the fourth embodiment based on the present disclosure, where a coreless substrate is mounted.

Referring to FIG. 22, an interposer 412 as an eighth modification of the interposer in the present embodiment is described. FIG. 22 is a cross-sectional view of interposer 412 where coreless substrate 502 is mounted. Second component 32*i* is included inside interposer 412. The lower surface of second component 32*i* is exposed on the lower surface of sealing resin layer 6, and covered with first-surface-side outer resin layer 51.

Ninth Modification

Figure 23:
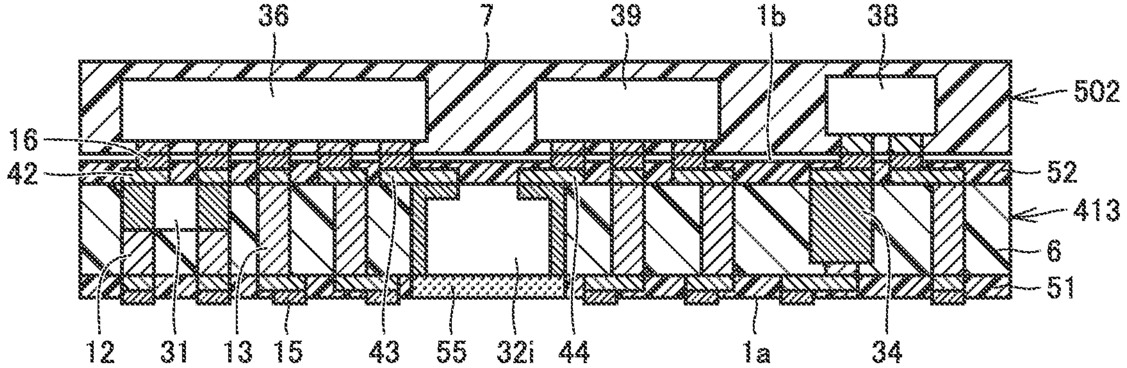
FIG. 23 is a cross-sectional view of an interposer according to a ninth modification of the fourth embodiment based on the present disclosure, where a coreless substrate is mounted.

Referring to FIG. 23, an interposer 413 as a ninth modification of the interposer in the present embodiment is described. FIG. 23 is a cross-sectional view of interposer 413 where coreless substrate 502 is mounted. Second component 32*i* is included inside interposer 413. The lower surface of second component 32*i* is exposed on the lower surface of sealing resin layer 6, and further covered with a heat dissipation promotion layer 55. First surface 1*a* is basically covered with first-surface-side outer resin layer 51 and, at a position where the lower surface of second component 32*i* is exposed, an opening is formed in first-surface-side outer resin layer 51, and heat dissipation promotion layer 55 is disposed to close this opening. In other words, second component 32*i* is covered with heat dissipation promotion layer 55, and heat dissipation promotion layer 55 is exposed on first surface 1*a*. Heat dissipation promotion layer 55 is formed from a nonconductive material. Heat dissipation promotion layer 55 refers herein to a layer formed from a material higher in heat dissipation property than the material forming first-surface-side outer resin layer 51. Thus, heat dissipation promotion layer 55 here is formed from a material higher in heat dissipation property than resist. Heat dissipation promotion layer 55 may be formed from a resin containing fillers, for example. The configuration thus provided with heat dissipation promotion layer 55 can be employed to promote heat dissipation from second component 32*i* to first surface 1*a*.

Fifth Embodiment

Figure 24:
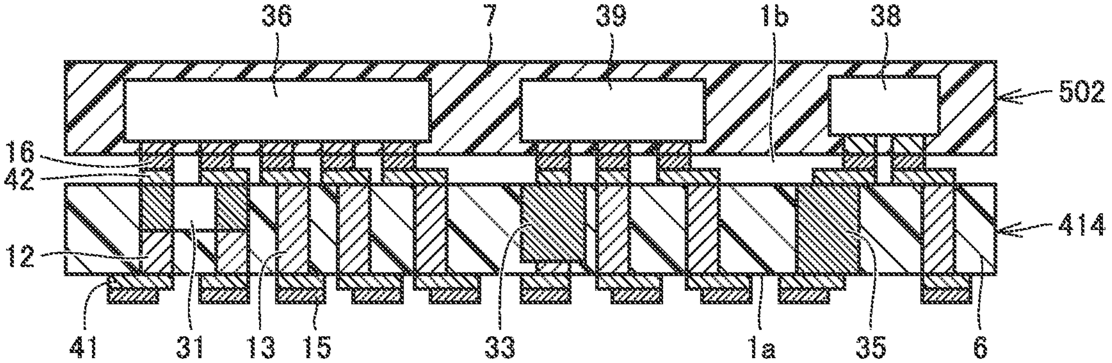
FIG. 24 is a cross-sectional view of an interposer according to a fifth embodiment based on the present disclosure, where a coreless substrate is mounted.

Referring to FIG. 24, an interposer according to a fifth embodiment based on the present disclosure is described. FIG. 24 presents a cross-sectional view of interposer 414 according to the present embodiment, where coreless substrate 502 is mounted.

Interposer 414 also has a basic configuration similar to the one described above regarding interposer 401 in the first embodiment. Interposer 414 in the present embodiment, however, has the following configuration.

Interposer 414 includes a fifth component 35 included inside sealing resin layer 6. Fifth component 35 is disposed to be exposed on first surface 1*a* or exposed on the surface of sealing resin layer 6 that is relatively closer to first surface 1*a*, and to be exposed on second surface 1*b* or exposed on the surface of sealing resin layer 6 that is relatively closer to second surface 1*b*. Namely, the height of fifth component 35 is identical to the height of sealing resin layer 6. Fifth component 35 extends through sealing resin layer 6 in the thickness direction. Fifth component 35 may be a capacitor, for example.

In the present embodiment, sealing resin layer 6 is made thin to match the height of fifth component 35, and therefore, the functionality of the interposer can be enhanced by having the component included therein and the thickness of the interposer can be reduced.

First Modification

Figure 25:
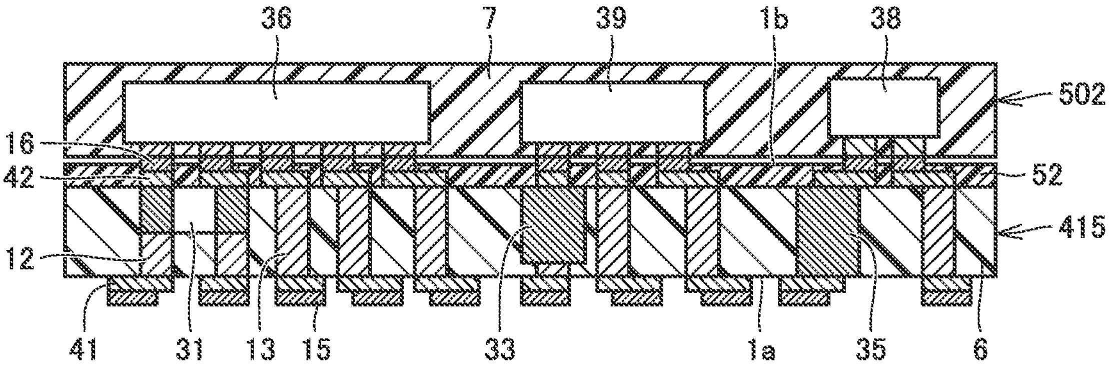
FIG. 25 is a cross-sectional view of an interposer according to a first modification of the fifth embodiment based on the present disclosure, where a coreless substrate is mounted.

Referring to FIG. 25, an interposer 415 as a first modification of the interposer in the present embodiment is described. FIG. 25 is a cross-sectional view of interposer 415 where coreless substrate 502 is mounted. Interposer 415 has a basic configuration similar to that of interposer 414, however, in second surface 1*b* of interposer 415, second-surface-side outer resin layer 52 is disposed to cover sealing resin layer 6. In this example, a part of the surface of second-surface-side wiring layer 42 that is not used as a land where a component is to be mounted, i.e., a part to which no solder is joined, is covered with second-surface-side outer resin layer 52, and therefore, short circuit to an adjacent solder joint can be made less likely to occur.

Second Modification

Figure 26:
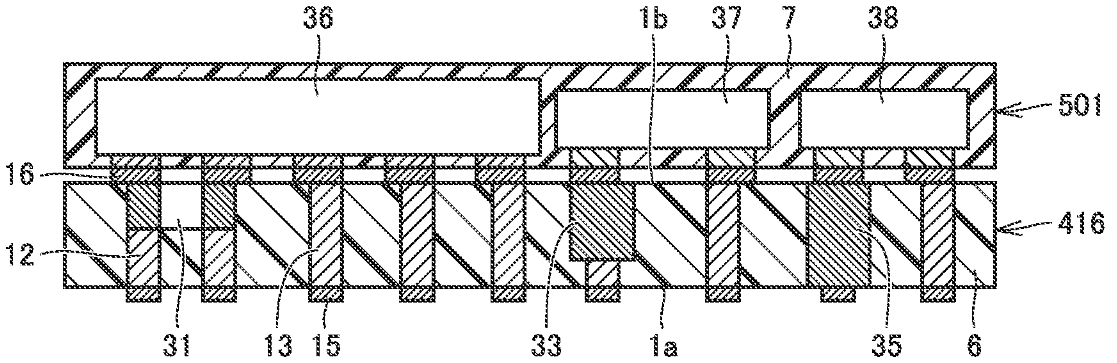
FIG. 26 is a cross-sectional view of an interposer according to a second modification of the fifth embodiment based on the present disclosure, where a coreless substrate is mounted.

Referring to FIG. 26, an interposer 416 as a second modification of the interposer in the present embodiment is described. FIG. 26 is a cross-sectional view of interposer 416 where coreless substrate 501 is mounted. While interposer 416 has a basic configuration similar to that of interposer 414, interposer 416 does not have first-surface-side wiring layer 41 on first surface 1*a* and does not have second-surface-side wiring layer 42 on second surface 1*b*. In this example, the number of steps of the manufacturing method can be reduced, and accordingly the cost can be reduced. Plating film 16 sized to conform to the size of an electrode exposed from coreless substrate 501 can be formed by partial plating by means of masking, for example.

Third Modification

Figure 27:
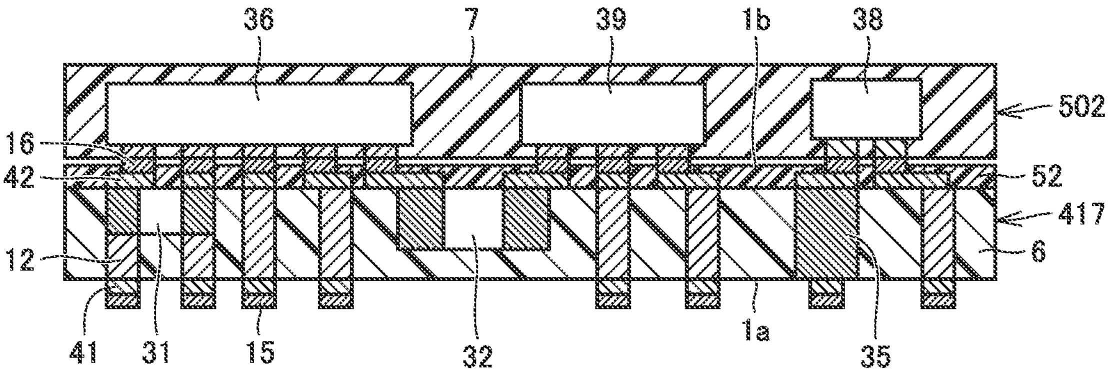
FIG. 27 is a cross-sectional view of an interposer according to a third modification of the fifth embodiment based on the present disclosure, where a coreless substrate is mounted.

Referring to FIG. 27, an interposer 417 as a third modification of the interposer in the present embodiment is described. FIG. 27 is a cross-sectional view of interposer 417 where coreless substrate 502 is mounted. Second component 32 is included inside interposer 417. Second component 32 is disposed in the vicinity of second surface 1*b*. Second component 32 is connected to both components 36 and 39.

Two or more of the above-described embodiments may be employed by being combined as necessary.

The above-described embodiments in the present disclosure are examples in every respect and are not limiting. The scope of the present disclosure is defined by the claims and includes all changes within the purport and scope equivalent to the claims.

1*a* first surface; 1*b* second surface; 6 sealing resin layer (of interposer); 7 sealing resin layer (of coreless substrate); 12, 13 columnar conductor; 15, 15*i*, 15*j*, 16 plating film; 20 carrier; 21 resin layer; 22 adhesive layer; 23, 24 vertical hole; 31 first component; 32, 32*i*, 32*j* second component; 33, 34, 36, 37, 38, 39 component; 35 fifth component; 42 second-surface-side wiring layer; 42*e* metal film; 43 first electrode; 44 second electrode; 51 first-surface-side outer resin layer; 52 second-surface-side outer resin layer; 55 heat dissipation promotion layer; 401, 402, 403, 404, 405, 406, 407, 408, 409, 410, 411, 412, 413, 414, 415, 416, 417 interposer; 501, 502 coreless substrate

The invention claimed is:

1. An interposer having a first surface as a mounting surface and a second surface for mounting an object, the second surface being opposite to the first surface, the interposer comprising:

a first component exposed directly on the second surface or connected to the second surface via a conductor, the first component being included inside the interposer and located at a position closer to the second surface than to the first surface;

a sealing resin layer sealing the first component;

a columnar conductor electrically connecting a surface of the first component facing the first surface and the first surface, the columnar conductor being made of a uniform material filling a vertical hole; and a second component included inside the sealing resin layer, wherein the second component is exposed on the first surface, a first electrode to be connected to a third component included in the object and a second electrode to be connected to a fourth component included in the object are arranged on a surface of the second component closer to the second surface, and the second component is connected to both the first electrode and the second electrode.

2. The interposer according to claim 1, wherein the second component is a capacitor.

3. The interposer according to claim 1, further comprising a fifth component included inside the sealing resin layer, wherein the fifth component is arranged to be exposed on the first surface or on a surface of the sealing resin layer closer to the first surface, and to be exposed on the second surface or on a surface of the sealing resin layer closer to the second surface.

4. The interposer according to claim 1, wherein on the first surface, a first-surface-side outer resin layer is arranged so as to cover the sealing resin layer, and a first-surface-side wiring layer is arranged between the first-surface-side outer resin layer and the sealing resin layer, and electrical connection from the first component to the first surface is made via the first-surface-side wiring layer.

5. An interposer having a first surface as a mounting surface and a second surface for mounting an object, the second surface being opposite to the first surface, the interposer comprising:

a first component exposed directly on the second surface or connected to the second surface via a conductor, the first component being included inside the interposer and located at a position closer to the second surface than to the first surface;

a sealing resin layer sealing the first component;

a columnar conductor electrically connecting a surface of the first component facing the first surface and the first surface, the columnar conductor being made of a uniform material filling a vertical hole; and a second component included inside the sealing resin layer, wherein the second component is covered with a heat dissipation promotion layer, and the heat dissipation promotion layer is exposed on the first surface, a first electrode to be connected to a third component included in the object and a second electrode to be connected to a fourth component included in the object are arranged on a surface of the second component closer to the second surface, and the second component is connected to both the first electrode and the second electrode.

6. The interposer according to claim 5, wherein the second component is a capacitor.

7. The interposer according to claim 5, further comprising a fifth component included inside the sealing resin layer, wherein the fifth component is arranged to be exposed on the first surface or on a surface of the sealing resin layer closer to the first surface, and to be exposed on the second surface or on a surface of the sealing resin layer closer to the second surface.

8. The interposer according to claim 5, wherein on the first surface, a first-surface-side outer resin layer is arranged so as to cover the sealing resin layer, and a first-surface-side wiring layer is arranged between the first-surface-side outer resin layer and the sealing resin layer, and electrical connection from the first component to the first surface is made via the first-surface-side wiring layer.

9. An interposer having a first surface as a mounting surface and a second surface for mounting an object, the second surface being opposite to the first surface, the interposer comprising:

a first component exposed directly on the second surface or connected to the second surface via a conductor, the first component being included inside the interposer and located at a position closer to the second surface than to the first surface;

a sealing resin layer sealing the first component;

a columnar conductor electrically connecting a surface of the first component facing the first surface and the first surface, the columnar conductor being made of a uniform material filling a vertical hole; and a fifth component included inside the sealing resin layer, wherein the fifth component is arranged to be exposed on the first surface or on a surface of the sealing resin layer closer to the first surface, and to be exposed on the second surface or on a surface of the sealing resin layer closer to the second surface.

10. The interposer according to claim 9, further comprising a second component included inside the sealing resin layer, wherein a first electrode to be connected to a third component included in the object and a second electrode to be connected to a fourth component included in the object are arranged on a surface of the second component closer to the second surface, and the second component is connected to both the first electrode and the second electrode.

11. The interposer according to claim 9, wherein the second component is a capacitor.

* * * * *